United States Patent [19]

Naito et al.

[11] Patent Number: 5,372,914

[45] Date of Patent: Dec. 13, 1994

[54] PATTERN FORMING METHOD

[75] Inventors: Takuya Naito, Tokyo; Osamu Sasaki, Sagamihara; Tsukasa Tada, Tokyo; Naoko Kihara, Matsudo; Toru Ushirogouchi, Yokohama; Satoshi Saito, Yokohama; Takashi Jonai, Yokohama; Hirokazu Niki, Yokohama, all of Japan

[73] Assignee: Kabushiki Kaisha Toshiba, Kawasaki, Japan

[21] Appl. No.: 36,254

[22] Filed: Mar. 24, 1993

[30] Foreign Application Priority Data

Mar. 24, 1992 [JP] Japan .................................. 4-65682

[51] Int. Cl.⁵ .............................................. G03C 5/00
[52] U.S. Cl. ................................. 430/296; 430/326; 430/330; 430/921; 430/270; 430/271; 430/273
[58] Field of Search .............. 430/273, 921, 326, 330, 430/276, 271, 270, 296

[56] References Cited

U.S. PATENT DOCUMENTS

| | | | |
|---|---|---|---|
| 4,454,222 | 6/1984 | Tada et al. | 430/326 |
| 4,745,045 | 5/1988 | Fredericks et al. | 430/315 |
| 4,822,718 | 4/1989 | Latham et al. | 430/271 |
| 4,910,122 | 3/1990 | Arnold et al. | 430/313 |
| 5,198,326 | 3/1993 | Hashimoto et al. | 430/326 |

FOREIGN PATENT DOCUMENTS

| | | |
|---|---|---|
| 0476865 | 3/1992 | European Pat. Off. . |
| 61-51923 | 3/1986 | Japan . |
| 3-249658 | 11/1991 | Japan . |

*Primary Examiner*—Janet C. Baxter
*Assistant Examiner*—Geraldine Letscher
*Attorney, Agent, or Firm*—Oblon, Spivak, McClelland, Maier & Neustadt

[57] ABSTRACT

On a substrate a protective layer is formed which can suppress the diffusion of a contaminant from the substrate. On the protective layer, thus formed, a resin layer is formed. The resin layer comprises a photosensitive composition containing a compound which has a substituent group capable of being decomposed or cross-linked in the presence of an acid, and a compound which can generate an acid when exposed to light. The resin layer is pattern-exposed to light and then baked at a predetermined temperature. The resin layer is developed, whereby the exposed portions of the resin layer are removed or left, thus forming a pattern comprising lines and spaces each having a predetermined width. Each of the lines of the pattern has a cross-section having neither sloped profile nor undercut profile, and the pattern therefore has an improved resolution.

16 Claims, 2 Drawing Sheets

PATTERN FORMING METHOD

BACKGROUND OF THE INVENTION

1. Field of the Invention

The present invention relates to a pattern forming method.

2. Description of the Related Art

Micropatterning is performed in manufacture of various electronic components such as semiconductor integrated circuits including LSIs (Large-Scale Integrated Circuits). It is demanded that resist patterns be formed with so high a precision that the patterns may serve to manufacture electronic components each having a high integration density.

An example of resist for use in micropatterning is chemical amplification-type resist disclosed in, for example, Published Unexamined Japanese Patent Application 63-27829. The resist is a composition which contains an alkali-soluble resin, a dissolution inhibitor and an acid generator. Unless the composition is exposed to light, the dissolution inhibitor inhibits the alkali-soluble resin from being dissolved in an alkaline solution. When the composition is exposed to light, x ray or high-energy electron beam, the acid generator generates an acid. The acid decomposes the dissolution inhibitor as the composition is baked. Namely, this composition is equivalent to a positive type resist any portion of which becomes alkali-soluble when exposed to light, X ray or high-energy electron beam and can thereafter be dissolved in an alkaline developing solution.

The method employed hitherto to form a pattern by using a positive type resist, will be described as follows. First, a substrate is coated with the resist, forming a resist layer. Next, the resist layer is selectively exposed to light. After the exposure, the resist layer is baked and developed with an alkaline developing solution. As a result, the exposed portions of the resist layer are dissolved and removed, thereby forming a desired resist pattern comprising lines and spaces.

The pattern formed by the conventional method using the positive type resist described above may, however, comprise lines each having a cross-section which has a sloped profile, or slopes down to surface of spaces, depending on the material of the substrate. Consequently, the resist pattern has but a limited resolution and cannot be used as a mask in the micropatterning of electronic components. In particular, the resist pattern cannot serve to form extremely narrow grooves or very small contact holes, since the cross-section of each line has a sloped profile.

Figure 1:
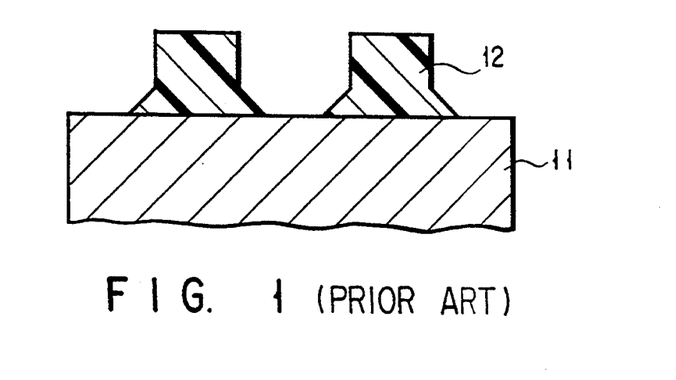
FIG. 1 is a cross-sectional view showing a resist pattern formed by a conventional method using a positive type resist.

FIG. 1 is a cross-sectional view of part of a positive type resist pattern 12 formed on a substrate 11 by the conventional method. As shown in FIG. 1, each line of the pattern 12 has a cross-section having a sloped profile. Due to the sloped profile, each line fails to have a prescribed width, and the space between any two adjacent lines have a designed width.

Another example of resist for use in micropatterning is a composition which contains an acid generator, an alkali-soluble resin, and a compound having a substituent group capable of cross-linking the resin in the presence of an acid. When the composition is exposed to light, X rays or high-energy electron beams, the acid generator generates an acid. The acid promotes the cross-linking of the resin as the composition is baked. Hence, this composition is equivalent to a negative type resist any portion of which becomes alkali-insoluble when exposed to light, X ray or high-energy electron beam, and will not be dissolved in an alkaline developing solution.

Hitherto, a pattern of negative type resist is formed by a method similar to the above-described method of forming a pattern of positive type resist. More specifically, a substrate is coated with the negative type resist, forming a resist layer. Next, the resist layer is selectively exposed to light. After the exposure, the resist layer is baked, rendering the exposed portions alkali-insoluble. The resist layer is then developed with an alkaline developing solution. As a result, the unexposed portions of the resist layer are dissolved and removed, whereas the exposed portions remain on the substrate, forming a desired resist pattern.

The formed by the conventional method using the positive type resist pattern may, however, comprise lines each having a cross-section which has an undercut profile, or a narrowed root, depending on the material of the substrate. Consequently, the resist pattern has but a limited resolution and cannot be used as a mask in the micropatterning of electronic components.

Figure 2:
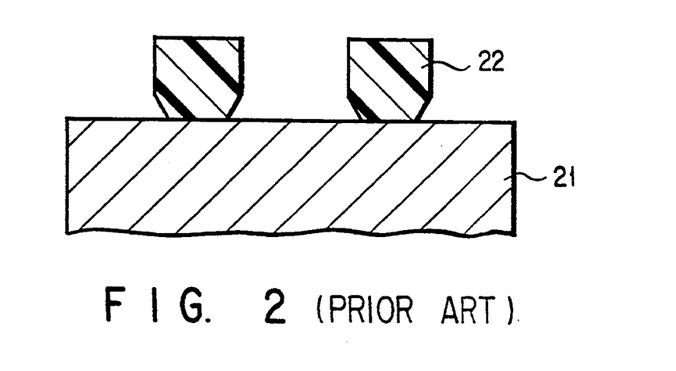
FIG. 2 is a cross-sectional view showing a resist pattern formed by a conventional method using a negative type resist.

FIG. 2 is a cross-sectional view of part of a negative type resist pattern 22 formed on a substrate 21 by the conventional method. As shown in FIG. 2, each line of the pattern 22 has a cross-section having an undercut profile. Due to the undercut profile, each line fails to have a prescribed width, and the space between any two adjacent lines have a designed width.

SUMMARY OF THE INVENTION

Accordingly, the object of the present invention is to provide a pattern forming method capable of forming a resist pattern which comprises lines and spaces, each line having a cross-section having neither a sloped profile nor an undercut profile, and which therefore excels in resolution performance and can suitably be used in micropatterning electronic components.

To attain this object, the inventors hereof have repeated studies and researches. The thought that the cross-section of a resist pattern is deformed since the basic contaminant diffusing from the substrate reduces the activity of the acid which is generated to decompose the dissolution inhibitor in the case of using a positive type resist or to promote the cross-linking reaction in the case of using a negative resist. Then did they find that the cross-section of a resist pattern of either type would be greatly improved by prevent or minimize the interaction between the substrate and the resist layer so as to suppress diffusion of the contaminant from the substrate to the resist layer.

The object of the invention, described above, can be achieved by a pattern forming method which comprises the steps of:

(a) forming on a substrate a protective layer capable of suppressing diffusion of a contaminant from the substrate;

(b) forming on the protective layer a resin layer which comprises a photosensitive composition containing a compound having a substituent group capable of being decomposed cross-linked in the presence of an acid and a compound which generates an acid when exposed to light;

(c) pattern-exposing the resin layer to light;

(d) baking the resin layer at a predetermined temperature after exposure; and (e) developing the resin layer, thereby to selectively remove or leave the exposed portions of the resin layer.

The method according to the present invention is characterized in that a protective layer is formed on a substrate, a resin layer made chiefly of a photosensitive composition is formed on the protective layer, and the resin layer is processed into a pattern.

In the case of forming a resin layer made mainly of a photosensitive composition containing a compound (a dissolution inhibitor) having a substituent group capable of being decomposed in the presence an acid in the step (b), an acid is generated in the light-exposed portions of the resin layer in the step (c). When the resin layer is baked in the step (d), the acid decomposes the dissolution inhibitor (the substituent group) in the light-exposed portions of the resin layer. Hence, these portions of the resin layer are dissolved and removed when the resin layer is developed with an alkaline developing solution in the step (e), whereby a pattern is formed on the protective layer. In the process of forming the pattern, the protective layer prevents any contaminant from diffusing from the substrate to the resin layer, and the activity of the acid generated in the exposed portions of the resin layer is scarcely reduced. As a result, the acid decomposes the dissolution inhibitor efficiently. The exposed portions of the resin layer thereby exhibit uniformly alkali-solublity, i.e., the higher dissolution rate in an alkaline solution. The exposed portions of the resin layer can therefore be readily dissolved in the alkaline developing solution, forming a pattern which comprises lines and spaces, each line having a cross-section which does not have a sloped profile but is rectangular.

In the case of forming a resin layer made mainly of a photosensitive composition containing a compound having a substituent group capable of being cross-linked in the presence of an acid in the step (b), an acid is generated in the light-portions of the resin layer in the step (c). When the resin layer is baked in the step (d), the above compound (the substituent groups) are cross-linked in the presence of the acid, in the light-exposed portions of the resin layer. Hence, these portions of the resin layer are not dissolved as the resin layer is developed with an alkaline developing solution in the step (e), and remain on the protective layer, thereby forming a pattern on the protective layer. In the process of forming the pattern, the protective layer prevents any contaminant from diffusing from the substrate to the resin layer, and the activity of the acid generated in the exposed portions of the resin layer is scarcely reduced. As a result, the acid helps the above compound having the substituent group to be cross-linked efficiently. The exposed portions of the resin layer are thereby made uniformly alkali-insoluble. The exposed portions of the resin layer can therefore remain unsolved by the alkaline developing solution, forming a pattern which comprises lines and spaces, each line having a cross-section which does not have an undercut profile but is rectangular.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A pattern forming method, which is an embodiment of the present invention, will be described with reference to FIGS. 3A to 3F. In this method, used is a photosensitive composition, or a positive type resist which contains a compound having a substituent group capable of being decomposed in the presence of an acid.

Figure 3A:
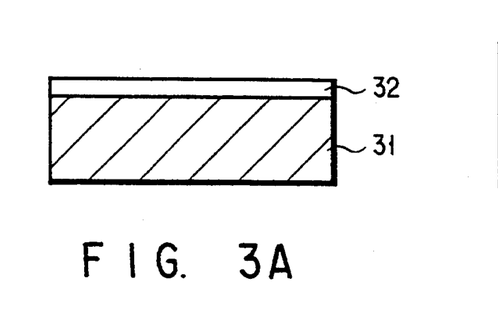
FIGS. 3A to 3F are cross-sectional views explaining how a resist pattern is formed by an method according to the present invention.

In the first step (step a), a protective layer 32 is formed on a substrate B1 as is shown in FIG. 3A. The layer 32 is capable of suppressing diffusion of a contaminant from the substrate 31. The substrate 31 is, for example, a deposited chromium mask substrate, a deposited aluminum mask substrate, a BPSG-coated substrate, a PSG-coated substrate, or an SOG-coated substrate. Nonetheless, the substrate 31 is not limited to these examples.

The protective layer 32 formed on the substrate 31 must meet three requirements. First, the layer 32 should remain unmixed with the resist being coated on it. Therefore, the layer 32 should not perform physical reaction (e.g., mixing) or chemical reaction with any component of the resist used, and should not be affected by the solvent used for the resist, a typical example of which is 1-acetoxy-2-ethoxyethane (ethyl cellosolve acetate). Second, the layer 32 preferably has a thickness of about 0.003 to 0.3 $\mu$m, so that it may prevent diffusion of a contaminant from the substrate 31 and may not degrade the resolution of a resist pattern which will be formed. Third, the layer 32 can be removed by wet etching using an acid or an alkaline solution, or by reactive ion etching (RIE) after a resist pattern is formed on the layer 32, so that the resist pattern may be transferred onto the substrate 31.

To satisfy the three requirements, the protective layer 32 may be an inorganic film comprising carbon, silicon, or a compound thereof. Alternatively, for the same purpose, the layer 32 may be an organic film comprising a thermosetting resin or an organic polymer capable of forming three-dimensional molecular structure.

The protective layer 32 can be formed by a method selected from many in accordance with its material. If the layer 32 is an inorganic film, it can be formed by means of vapor deposition, CVD method, or the like. If the layer 32 is an organic layer, it can be formed by spin-coating, CVD method, or the like, using a solution of the organic compound.

Figure 3B:
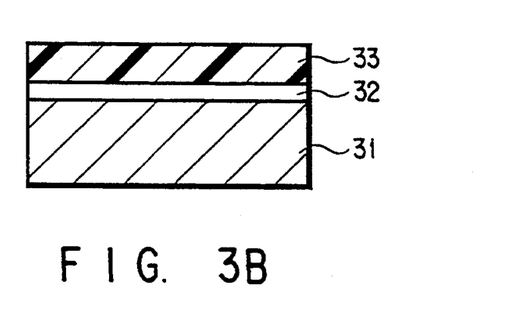

In the second step (step b) of the pattern forming method, a solution of a resist is coated on the protective layer 32 and baked at a predetermined temperature, thereby forming a resist layer 33 as is illustrated in FIG. 3B. Preferably, the resist is a chemical amplification-type one, such as a photosensitive composition (positive type resist) which contains an alkali-soluble resin, a compound (dissolution inhibitor) having a substituent group capable of being decomposed in the presence of an acid, and a compound (acid generator) capable of generating an acid when exposed to light. The alkaline-soluble resin and the dissolution inhibitor may be identical. Examples of the resist are resists in which an acid functions as a catalyst disclosed in Published Unexamined Japanese Patent Applications 59-45439, 60-263143, and 63-250642.

Figure 3C:
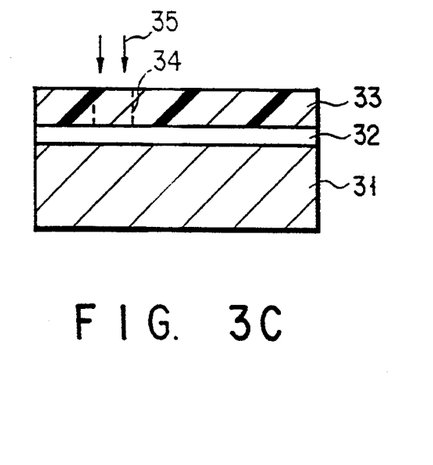

Next, in the third step (step c), as is shown in FIG. 3C, the resist layer 33 is pattern-exposed to light (radiation 35). In other words, the portions 34 (only one shown) of the resist layer 33 is selectively exposed to light. The radiation 35 may be ultraviolet radiation, X ray, high-energy electron beam, charge corpucular beam, synchrotron radiation, radiation emitted form a high-charge mercury lamp, radiation of excimer laser, or the like.

Figure 3D:
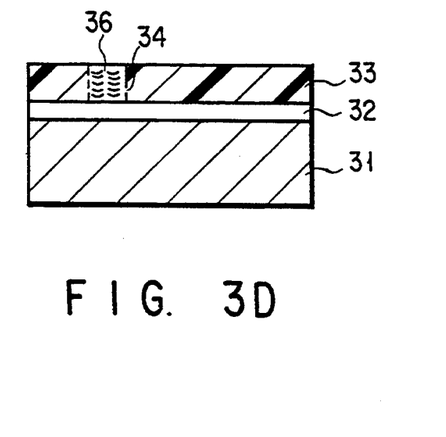

The third step (step c) is followed by the fourth step, in which the resist layer 33 is subjected to post-exposure baking as is illustrated in FIG. 3D, forming a latent image which is defined by the exposed portions 34 of the layer 33.

Figure 3E:
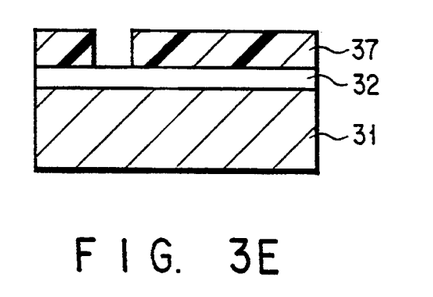

Thereafter, in the fifth step (step e), the resist layer 33 is developed by a prescribed developing solution, whereby the selected portions 34 defining the latent image 36 are dissolved and removed as is shown in FIG. 3E. As a result, a resist pattern 37 is formed on the protective layer 32. The developing solution used in the fifth step (step e) is one selected in accordance with the type of the resist. An example of the solution is an alkaline developing solution such as a tetramethylammonium hydroxide solution.

Figure 3F:
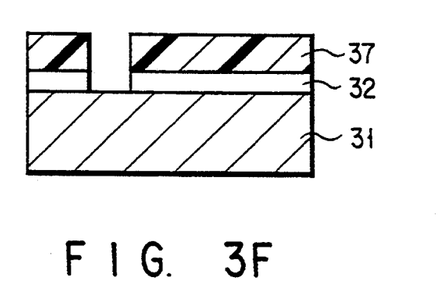

After the above steps, the resist pattern 37 formed on the protective layer 32 which in turn is formed on the substrate 31 is processed, if necessary, by $O_2$ asher, thereby to remove bridges or scums from the resist pattern 37. Further, as shown in FIG. 3F, the specific portions of the protective layer 32 are selectively peeled from the substrate 31 by using the resist pattern 37 as a mask and by applying a solution identical to the developing solution used in the fifth step or by any other developing solution, or by means of RIE or $O_2$ asher.

Next, the substrate 31 is selectively etched by using the resist pattern and the protective pattern as etching masks, thereby micropatterning the substrate.

In the pattern forming method, it is possible to use, as a resist, a composition (i.e., a negative type resist) which contains a compound having a substituent group capable of being cross-linked in the presence of an acid. If a composition of this type is used, the exposed portions of the resist layer remain on the protective layer. In other words, in the developing step (see FIG. 3E), any exposed portion 34 of the resist layer remains unsolved by the developing solution, forming a line of a resist pattern, not forming a space as is shown in FIG. 3E.

The protective layer formed in the first step (step a) should better be an organic film, rather than any other type exemplified above, since a organic film can be removed more easily after the resist pattern is formed. The organic film may comprise polyamide resin, polyimide resin, polyamideimide resin, polyaminobismaleimide resin, polyetherimide, phenolic resin, diallylphthalate resin, urea resin, alkyde resin, urethane resin, unsaturated polyester resin, polysulfone, polyethersulfone, polyparaxylylene, melamine resin, Bakelite (phenol-formaldehyde resin), epoxy resin, a derivative of any of these, or the like. Nevertheless, the material of the organic film is not limited to these. Any of these resin, selected, is coated, in the form of varnish, on the substrate 31, and then either left to stand or cured by heat or ultraviolet rays, thereby forming a protective layer. In order to cure the resin, a curing agent may be added to the resin. Alternatively, for the same purpose, a photosensitive curing agent or heat-sensitive curing agent, such as bisazide compound or diazo compound disclosed in Published Unexamined Japanese Patent Applications 56-1933, 60-14235, 61-240237, and 63-170639 may be added to the resin. In the present invention it is particularly desirable that the organic film be a polymer film comprising a polyimide resin represented by the following formula (1) and containing a precursor (polyamic acid) in which the imide ring is not completely imidized in part or entirety, or comprising the polyimide precursor.

wherein $R_1$ is a tetravalent organic group, $R_2$ is a divalent organic group, and n represents the degree of polymerization.

Examples of the tetravalent organic group $R_1$ are as follows:

Examples of the divalent organic group $R_2$ are as follows:

The tetravalent organic group and the divalent organic group are those in which some or all of the hydrogen atoms may be substituted by alkyl groups, halogen atoms, nitro groups, hydroxyl groups, carboxyl groups, esterified carboxyl groups, or the like. Also, some or all of the aromatic rings contained in these organic groups may be heterocyclic rings in which some or all of the carbon atoms are substituted with nitrogen atoms, oxygen atoms, sulfur atoms, or the like.

In the present invention, the protective layer formed on the substrate may preferably be a polymer film which comprises epoxy resin. The epoxy resin has been synthesized from a compound each molecule of which contains two or more functional groups such as epoxy group, oxylane groups, ethoxylene group, or the like. Stated more specifically, the epoxy resin has been synthesized by having this compound ring-opening polymerized by using a polyfunctional or catalytic curing agent. Examples of the compound containing said functional groups are: phenol-based glycidylether type epoxy resin, alcohol-based glycidylether type epoxy resin, glycidylester type epoxy resin, glycidylamine type epoxy resin, aliphatic ring type epoxy resin, and a mixture of these. Some or all of the hydrogen atoms of the epoxy resin may be substituted by alkyl groups, halogen groups, nitro groups, hydroxyl groups, carboxyl groups, esterified carboxyl groups, and the like. Further, some or all of the aromatic rings and aliphatic rings contained in the epoxy resin may be heterocyclic rings in which some of the carbon atoms are substituted by nitrogen atoms, oxygen atoms, sulfur atoms, or the like. Examples of the curing catalyst are catalytic one (curing catalyst) such as aliphatic polyamine, amidoamine, polyamide, aromatic polyamine, acid anhydride, polyphenyl, or boron trifluoride-amine complex, and a coreacting resin (cross-linking agent) such as phenolic resin.

Moreover, the protective layer, which is formed in the first step of the pattern forming method according to the invention, may preferably a polymer film comprising polyacrylate resin represented by the following formula (2), a resin containing a compound in which some or all of α-positions of that polyacrylate are substituted by halogen atoms, or α-chloropolyacrylate.

wherein $R_3$ and $R_4$ may be the same or different, and are independently hydrogen, a halogen atom, or an alkyl group which can be substituted by a halogen atom, and n presents the degree of polymerization.

The polymer film comprising polyacrylate resin, exemplified above, can be dry-etched much faster than the resist layer and, hence, be more readily removed after the resist pattern is formed. In particular, the polymer film can be removed very fast by means of $O_2$ asher. The polyacrylate resin tends to be decomposed by high energy. Therefore, in the case that the polyacrylate resin can preferably be used as an undercoating film for positive type resist. In addition, it can be easily dissolved and removed, when treated with a weakly polar solvent such as toluene (a poor solvent for the positive type resist) after a resist pattern has been formed.

In the pattern forming method, the positive or negative chemical amplification-type resit described above is preferably used as the material of the resin layer, that is, the resist layer formed on the protective layer. More specifically, the following photosensitive compositions (RA), (RB), and (RC) suit the materials of the resist layer. Use of any of the compositions enables a pattern having a high resolution to be formed. The compositions will be described in detail as follows.

The photosensitive composition (RA) comprises an alkali-soluble resin, a compound (dissolution inhibitor) which has a substituent group decomposable in the presence of an acid and generates an alkali-soluble group upon decomposition of the substituent group, or a compound which has a substituent group capable of cross-linking the alkali-soluble resin in the presence of an acid, and a compound which generates an acid upon exposure and which is represented by formula (3) given below:

wherein $R_{31}$ represents a monovalent organic group or a monovalent organic group into which at least one selected from the group consisting of a halogen atom, a nitro group, and a cyano group is introduced, each of $R_{32}$, $R_{33}$, and $R_{34}$ independently represents hydrogen, a halogen atom, a nitro group, a cyano group, a monovalent organic group, or a monovalent organic group into which at least one selected from the group consisting of a halogen atom, a nitro group, and a cyano group is introduced.

The photosensitive composition (RB) comprises an alkali-soluble resin, a compound (dissolution inhibitor) which has a substituent group decomposable in the presence of an acid and generates an alkali-soluble group upon decomposition of the substituent group, or a compound which has a substituent group capable of cross-linking the alkali-soluble resin in the presence of an acid, and a compound which generates an acid upon exposure, which is represented by formula (4) given below:

(4)

wherein each of $R_{41}$ and $R_{43}$ independently represents a monovalent organic group or a monovalent organic group into which at least one selected from the group consisting of a halogen atom, a nitro group, and a cyano group is introduced, and $R_{42}$ represents a sulfonyl or carbonyl group.

The photosensitive composition (RC) comprises an alkali-soluble resin, a compound (dissolution inhibitor) which has a substituent group decomposable in the presence of an acid and generates an alkali-soluble group upon decomposition of the substituent group, or a compound which has a substituent group capable of cross-linking the alkali-soluble resin in the presence of an acid, and a compound which generates an acid upon exposure, which is represented by formula (5) given below:

(5)

wherein each of $R_{51}$, $R_{52}$, and $R_{55}$ independently represents a monovalent organic group or a monovalent organic group into which at least one selected from the group consisting of a halogen atom, a nitro group, and a cyano group is introduced, $R_{53}$ represents hydrogen, a monovalent organic group, or a monovalent organic group into which at least one selected from the group consisting of a halogen atom, a nitro group, and a cyano group is introduced, and $R_{54}$ represents a sulfonyl group, a sulfinyl group, a sulfur atom, and a carbonyl group.

The photosensitive compositions (RA), (RB), and (RC) are chemical amplification type resists whose alkali-solubility (dissolution rate in an alkaline solution) can change.

When the photosensitive composition contains a compound (dissolution inhibitor) having a substituent group decomposable in the presence of an acid, a resin component is insoluble in an alkaline solution by the behavior of this compound in a nonexposed state. Once the composition is exposed to light and baked, an acid is generated from the acid generator and the compound is decomposed by the acid to generate an alkali-soluble group. As a result, the resin component at an exposed portion of the photosensitive composition becomes soluble in the alkaline solution. In this case, the photosensitive composition functions as a positive type resist in which only the exposed portion is dissolved in the alkaline solution and is removed.

On the other hand, when the photosensitive composition contains a compound having a substituent group capable of cross-linking the alkali-soluble resin in the presence of an acid, the resin component is soluble in the alkaline solution in a nonexposed state. Once the composition is exposed to light and baked, an acid is generated from the acid generator and the compound crosslinks the resin component by the behavior of the acid generated. As a result, the resin component at the exposed portion of the photosensitive composition becomes insoluble in the alkaline solution. In the case, the photosensitive composition functions as a negative type resist in which only the exposed portion is not dissolved in the alkaline solution and is left.

The acid generator of the components in each of the compositions (RA), (RB), and (RC) is a compound which can generate an acid upon exposure to light, i.e., ultraviolet radiation having a short wavelength, electron beam, X-ray, or the like. The photosensitive compositions are characterized in that a compound containing a sulfonyl group, which is represented by each of the formulas (3) to (5) given above is used as the acid generator.

In the method of the present invention, the acid any of the compounds represented by the formula (3), (4) and (5) generates upon exposure (the third step, or step c) not liable to lose its activity during the period from the exposure to the baking (the fourth step, or step d). The photosensitive compositions (RA), (RB), and (RC) remain very stable over all steps of the method according to the invention, and excel in sensitivity and resolution. Particularly, in the case where any of these compositions functions as a positive type resist, the compound of the formula (3), (4) or (5) inhibits the unnecessary cross-linking of the alkali-soluble resin during the baking performed after the exposure, thereby making the exposed portion of the composition more alkali-soluble than otherwise, preventing a decrease in sensitivity, and making it possible to form a pattern having high resolution.

In the composition (RA), the compound (3) used as the acid generator is an organic compound containing one sulfonyl group.

Examples of the monovalent organic groups introduced into the compound (1) as $R_{31}$, $R_{32}$, $R_{33}$, and $R_{34}$ are allyl, anisyl, anthraquinolyl, acetonaphthyl, anthryl, azulenyl, benzofuranyl, benzoquinolyl, benzoxazinyl, benzoxazolyl, benzyl, biphenylenyl, bornyl, butenyl, butyl, cinnamyl, cresotoyl, cumenyl, cyclobutanedienyl, cyclobutenyl, cyclobutyl, cyclopentadienyl, cyclopentatrienyl, cycloheptyl, cyclohexenyl, cyclopentyl, cyclopropyl, cyclopropenyl, decyl, dimethoxyphenetyl, diphenylmethyl, docosyl, dodecyl, eicosyl, ethyl, fluorenyl, furfuryl, geranyl, heptyl, hexadecyl, hexyl, hydroxymethyl, indanyl, isobutyl, isopropyl, isopropylbenzyl, isoquiazolyl, menthyl, mesityl, methoxybenzyl, methoxyphenyl, methyl, methylbenzyl, naphthyl, naphthylmethyl, nonyl, norbonyl, octacosyl, octyl, oxazinyl, oxazolydinyl, oxazolynyl, oxazolyl, pentyl, phenacyl, phenansulyl, phenethyl, phenyl, phthalydyl, propynyl, propyl, pyranyl, pyridyl, quinazonyl, quinolyl, salicyl, terephthalyl, tetrazolyl, thiazonyl, thiaphthenyl, thienyl, tolyl, trityl, trimethylsilylmethyl, trimethylsilyloxymethyl, undecyl, valeryl, veratyl, and xylyl. Of all the above groups, a group in which a halogen atom, a nitro group, or a cyano group is substituted for the hydrogen atom can be used as the monovalent organic group into which at least one selected from the group consisting of a halogen atom, a nitro group, and a cyano group is introduced.

Examples of the compound (3) are pheneylmethylsulfone, ethylphenylsulfone, phenylpropylsulfone, methylbenzylsulfone, benzylsulfone (dibenzylsulfone), methylsulfone, ethylsulfone, butysulfone, methylethylsulfone, methylsulfonylacetonitrile, phenylsulfonylacetonitrtle, toluenesulfonylacetonitrile, benzylphenylsulfone, nitrophenylsulfonylacetonitrile, fluorophenylsulfonylacetonitrile, chloroohenylsulfonylacetonitrile, methoxyphenylsulfonylacetonitrile, α-methylphenylsulfonylacetonitrile, ethylsufonylacetonitrile, methythiomethyl-p-tolylsulfone, phenylsulfonylacetophenone, phenylsulfonylpropionitrile, phenylsulfonylpropionic acid and an ester compound thereof, bromomethyl-2-(phenylsulfonylmethyl)benzene, naphthylmethylsulfone, 1-methyl-2-((phenylsulfonyl)methyl)benzene, and trimethyl-3-(phenylsulfonyl)orthopropionate.

According to the present invention, the compound (3) having an electron withdrawing group as at least one of $R_{32}$, $R_{33}$, and $R_{34}$, particularly having a cyano group or a nitro group as such, is preferable since they have high efficiency of an acid generation during exposure and increases the sensitivity of the photosensitive composition (resist). The compound containing a hydrogen atom as at least one of $R_{32}$, $R_{33}$, and $R_{34}$ has a high alkali solubility. When development using an alkaline solution for a resist is employed, this compound is preferable to suppress production of scums.

In the compound (3), $R_{31}$ and $R_{32}$, $R_{33}$, or $R_{34}$ may be combined to form a ring, or at least two of $R_{32}$, $R_{33}$, and $R_{34}$ may be combined to form a ring. In this case, examples of a derived cyclic compound are phenylsulfonytetrahydropyran, phenylsulfonylcyclohexane, a thiopyrandioxide compound (e.g., 3-phenyl 2H-thiopyran 1,1-dioxide, and 6-methyl-3-phenyl 2H-thiopyran 1,1-dioxide), trimethylenesulfone, tetramethylenesulfone, a biscyclictrisulfone compound (e.g., 4-methyl-2,6,7-trithiabicyclo[2,2,2]-octane-2,2,6,6,7-hexaoxide), and the following compounds.

The compound (4) used as the acid generator in the composition (RB) is an organic compound in which two sulfonyl groups, or one sulfonyl group and one carbonyl group are bonded to a specific carbon atom. Monovalent organic groups introduced as $R_{41}$ and $R_{43}$ in the compound (4) are the same groups exemplified as monovalent organic groups introduced in the compound (3). At least one selected from the group consisting of a halogen atom, a nitro group, and a cyano group may be substituted for the hydrogen atom in each of these organic groups.

Examples of the compound (4) are bis(phenylsulfonyl)methane, bis(methylsulfonyl)methane, bis(ethylsulfonyl)methane, (methylsulfonyl)(phenylsulfonyl)methane, phenylsulfonylacetophenone, and methylsulfonylacetophenone.

According to the present invention, the compound (4) is preferable since it has high alkali solubility and high efficiency of an acid generation during exposure to increase the sensitivity of the photosensitive composition (resist).

In the compound (4), $R_{41}$ and $R_{43}$ may he combined to form a ring. A derived cyclic compound can be exemplified by the following cyclic sulfone compounds:

The compound (4) has high alkali-solubility and can generate an acid at high efficiency when exposed to light. Hence, it is an acid generator desirable for use in the method of this invention since it can increases the sensitivity of the photosensitive composition (RB).

The compound (5) used as the acid generator in the composition (RC) is an organic compound in which at least two sulfonyl groups and a linking group containing sulfer or one carbonyl group is bonded to the specific carbon atom. The monovalent organic groups introduced as $R_{51}$, $R_{52}$, $R_{53}$, and $R_{55}$ in the compound (5) are exemplified as the same monovalent organic groups introduced in the compound (3). In addition, at least one selected from the group consisting of a halogen atom, a carboxyl group, a cyano group, a hydroxyl group, a carboxyl group. or an esterified carboxyl group may be substituted for the hydrogen atom of these organic groups. $R_{54}$ preferably represents a sulfonyl group, a sulfinyl group, or a sulfur atom.

Examples: of the compound (5) are tris(phenylsulfonyl)methane, phenylthio-bis(phenylsulfonyl)-methane, phenylmercapto-bis(methylsulfonyl)-methane, tris(methylsulfonyl)methane, tris(ethylsulfonyl)methane, bis(phenylsulfonyl)-methylsulfonyl-methane, bis(methylsulfonyl)-phenylsulfonyl-methane, phenylsulfonyl-ethylsulfonyl-methylsulfonyl-methane, tris(4-nitrophenylsulfonyl)methane, tris(2,4-nitrophenylsulfonyl)methane, bis(phenylsulfonyl)-(4-nitrophenylsulfonyl)-methane, bis(phenylsulfonyl)-(3-nitrophenylsulfonyl)-methanc, bis(phenylsulfonyl)-(2-nitrophenylsulfonyl)-methane, bis(phenylsulfonyl)-(p-tolylsulfonyl)-methane, bis(methysulfonyl)-(4-nitrophenylsulfonyl)-methane, bis(methysulfonyl)-(4-chlorophenylsulfonyl)-methane, bis(phenylsulfonyl)-(4-fluorophenylsulfone)-methane and 1,1,1-tris(phenylsulfonyl)ethane.

In the method of the present invention, when the above photosensitive composition is exposed to KrF excimer laser light, the compound (3), (4), or (5) in which $R_{31}$, at least one of $R_{41}$ and $R_{43}$, or at least one of $R_{51}$, $R_{52}$, and $R_{55}$ is an aromatic group, is preferable to improve resistance to dry etching and heat resistance of the composition. In addition, an acid generator having a melting point of 50° C. or more and high solubility in an organic solvent is also preferable.

When the compound (3), (4), or (5) is a sulfonyl compound, e.g., sulfonamide, containing a basic substituent group, an acid generated upon exposure loses its activity in same cases. When the compound (3), (4), or (5) is a sulfonyl compound which contains an acidic group having high alkali solubility such as sulfonic acid compound, the alkali solubility of the nonexposed portion of the photosensitive composition may be excessively increased. For this reason, use of the kinds of the sulfonyl compounds as the acid generators in the above compositions may be strictly limited.

The content of an acid generator in each of the photosensitive compositions, i.e., the content of the compound (3) in the composition (RA), the content of the compound (4) in the composition (RB) or the content of the compound (5) in the composition (RC), is at least about 0.1 part by weight and less than about 40 parts by weight based on 100 parts by weight of an alkali-soluble resin. If the content is less than 0.1 parts by weight, the sensitivity of the photosensitive composition tends to decrease. If the content is 40 parts by weight or more, film forming properties of the photosensitive composition tend to be degraded, and the dissolution rate of the photosensitive composition in the developing solution tends to greatly decrease. Most preferably, the content of the acid generator falls within the range of 2 to 10 parts by weight based on 100 parts by weight of the alkali-soluble resin.

The same alkali-soluble resin is used as resin component in the photosensitive compositions (RA), (RB), and (RC). The alkali-soluble resin will be described below.

A polymer having a phenol skeleton is generally used as the alkali-soluble resin. For example, this polymer is exemplified by: phenolic novolak resin. cresol novclak resin, xylenol-novolak resin, vinylphenol resin, and isopropenylphenol resin: a copolymer of vinylphenol and at least one component selected from the group consisting of an acrylic or methacrylic derivative, acrylonitrile, or a styrene derivative; and a copolymer of isopropenylphenol and at least one component selected from the group consisting of an acrylic or methacrylic derivative, acrylonitrile, or a styrene derivative. More specific examples of the above polymer are poly(p-vinylphenol), a copolymer of p-isopropenylphenol and acrylonitrile. a copolymer of p-isopropenylphenol and styrene, a copolymer of p-vinylphenol and methylmethacrylate, and a copolymer of p-vinylphenol and styrene. In addition. a silicon-containing alkalisoluble polymer such as polysiloxane having phenol in a side chain, polysilane having phenol in a side chain, or a novolak resin synthesized from phenol having silicon in a side chain may be used.

In the present invention, the alkali-soluble resin preferably has a softening point of 150° C. or more for forming a fine pattern. In particular, when electron beam is used as a radiation source, it is more preferable that the alkali-soluble resin has the above softening point and an average molecular weight of 3,000 to 8,000. The reasons are as follows.

When the resin component of a photosensitive composition used as resist material has a low softening point, an acid generated by an acid generator upon exposure is excessively diffused by baking performed after the exposure. The excessive diffusion of the acid causes blurring of a latent image on an exposed portion, and the resolution of the resist pattern finally formed may be undesirably decreased in some cases.

When a photosensitive composition containing a compound having a substituent group decomposable in the presence of an acid and a resin component having a distribution in the range of high molecular weights is exposed to ionizing radiation, the cross-linking reaction of the polymer chains of the resin may progress excessively during the exposure and baking performed after this exposure, and the image quality of the resist pattern may be degraded and its sensitivity may be undesirably decreased. In view of this, it is preferable to use an alkali-soluble resin which can satisfy conditions as to the softening point and the molecular weight as described above.

Desirable as an alkali-soluble resin particularly for use in a resist for exposure to ultraviolet radiation having a short wave-length or a resist exhibiting resistance to dry etching preferably is one which has an aromatic ring in a resin skeleton, a dissolution rate of about 0.1 to 500 nm/sec in an alkaline developing solution used (normally, a 2.38 wt % aqueous tetramethylammonium hydroxide solution) and a softening point of 150° C. or more.

Resins similar to the above listed alkali-soluble resins are exemplified as the alkali-soluble resins which satisfy the above-mentioned conditions as to the softening point and average molecular weight. Specific examples are novolak resins obtained by polycondensation of a phenol derivative with formaldehyde under an acidic condition. Examples of these novolak resins are: polymers each containing phenols cresols, xylenols, ethylphenols, butylphenols, halogenated phenols, naphthols or the like in its skeleton.

Other examples of the alkali-soluble resins are polyhydroxystyrene, melamine-formaldehyde resin, poly-4-hydroxymaleimide, poly-α-methylstyrene, a copolymer of 4-hydroxymaleimide, α-methylstyrene, or vinylphenol and acrylic acid or methacrylic acid, a copolymer of a vinyl-series compound containing an aromatic ring and polyacrylic acid or polymethacrylic acid, and a polyimlde precursor (polyamic acid). These resins may be used singly or in the form of a mixture containing at least two resins.

Of all the resins described above, the novolak resin having xylenol in a copolymer composition has solubility in an alkaline solution and heat resistance which are high enough to give a high resolution of a resist pattern to be formed. The novolak resin is particularly preferable as an alkali-soluble resin which satisfies the above conditions as to the softening point and the molecular weight. This novolak resin is exemplified by a resin having a copolymer composition which contains at least two components selected from the group consisting of 2,5-xylenol, 3,5-xylenol, m-cresol, p-cresol, and o-cresol and which contains at least 20 to 60 parts by weight of xylenol. In particular, a novolak resin containing 2,5-xylenol is excellent in alkalisolubility and heat resistance. A novolak resin containing 3,5-xylenol readily interacts with a compound containing a substituent group decomposable in the presence of an acid. It is preferable to mix these two novolak resins and use the resultant mixture.

More specifically, a novolak resin having the above copolymer composition preferably has a limited composition so as to satisfy the above conditions with respect to the softening point, the average molecular weight, and the dissolution rate. For example, when 2,5-xylenol is contained in the above copolymer composition, the content of xylenol preferably falls within the range of 20 to 60 parts by weight, the content of m-cresol preferably falls within the range of 30 to 80 parts by weight, and the content of p- and o-cresols preferably fall within the range of 0 to 50 parts by weight. When the copolymer composition contains 3,5-xylenol, the content of xylenol preferably falls within the range of 20 to 50 parts by weight, the content of m-cresol preferably falls within the range of 30 to 80 parts by weight, and the contents of p- and o-cresols preferably fall within the range of 0 to 50 parts by weight.

The novolak resin having the above copolymer composition may have a wide molecular weight distribution. To have a high softening point, however, it would be better for the resin to have a low content of low molecular weight substances, such as residual monomers or dimers, as it possible. The resin can have such a sufficiently low content of low molecular weight substances, such as residual monomers or dimers, by removing residual monomers or dimers at a higher degree of reducing pressure and increased temperature during the synthesis of novolak resin or by performing fractional precipitation after polymerization. In the above molecular weight distribution, the high molecular weight component contributes to an increase in softening point, and the low molecular weight component contributes to an increase in resolution of the resultant resist pattern. For this reason, components having the intermediate molecular weights may be adjusted by fractional precipitation to control the total molecular weight distribution of a polymer in accordance with specific properties required for the polymer.

In addition, as the resin component of the photosensitive composition, the novolak resin having the above copolymer composition can be partially or entirely substituted by vinylphenol resin, i.e., the vinylphenol resin can be mixed with the novolak resin, so that transparency to deep-ultraviolet radiation can be improved. Examples of this vinylphenol resin are: ordinary poly-vinylphenol: partially reduced poly-vinylphenol for improving on transparency, i.e., light transmittance; a poly-vinylphenol derivative in which some hydroxyl groups of poly-vinylphenol are protected with methyl, acetyl, butyloxycarbonyl, pyranyl or the like to control its dissolution rate; styrene-substituted polyvinylphenol which is prepared by adding styrene or the like to poly-vinylphenol with a platinum catalyst; and a copolymer of vinylphenol and styrene. The vinylphenol resin is added to the novolak resin in an amount of preferably at least 5% by weight, more preferably 20 to 100% by weight.

The same compound, i.e., the dissolution inhibitor, which has a substituent group decomposable in the presence of an acid, can be used in the photosensitive compositions (RA), (RB), and (RC).

Preferably, the dissolution inhibitor can be a compound which has a dissolution inhibition function for the alkali-soluble resin in the nonexposed state, contains the substituent group capable of being decomposed in the presence of an acid, and after the decomposition, is converted into a compound which generates —COO⁻ or —SO⁻ by a behavior of an alkaline solution. The composition containing the above dissolution inhibitor comes to exhibit high alkali solubility as it undergoes a series of processes such as exposure, baking, and development.

The above dissolution inhibitor is exemplified by a compound represented by formula (6) below:

Formula (6)

wherein $R_{61}$ and $R_{62}$ may be the same or different and each represents hydrogen, a halogen atom, a cyano group, a nitro group, a silyl group, or a monovalent organic group. $R_{61}$ and $R_{62}$ may be combined to form a ring. X represents $>C=O$ or $—SO_2—$. Y represents a bivalent organic group. Note that at least one of $R_{61}$, $R_{62}$, and Y has a substituent group decomposable in the presence of an acid.

Examples of the monovalent organic group introduced into $R_{61}$ or $R_{62}$ in the formula (6) are a substituted or nonsubstituted alkyl group ( e. g. , methyl, ethyl, propyl, isopropyl, iso-butyl, n-butyl, and t-butyl), a substituted or nonsubstituted aromatic group (e.g., phenyl, tolylnaphthyl, anthranyl, and pyridyl), and a substituted or nonsubstituted alicyclic or heterocyclic group (e.g., cyclohexyl, piperidyl, and pyranyl).

Examples of the bivalent organic group Y introduced into formula (b 6) are a substituted or nonsubstituted aliphatic group (e.g., ethylene, propylene, and butylene), a group derived from a substituted or nonsubstituted aromatic ring (e.g., benzene, naphthalene, anthracene, phenanthrene, pyridine, and piperidine), and a group derived from a substituted or nonsubstituted alicyclic or heterocyclic group (e.g., cyclohexane, pyrazine, pyran, and morpholane).

Examples of the group decomposable in the presence of an acid introduced into at least one of $R_{61}$, $R_{62}$, and Y in formula (6) are esters (e.g., t-butyl ester, isopropyl ester, ethyl ester, methyl ester, and benzyl ester), ethers (e.g., tetrahydropyranyl ether), alkoxycarbonyl groups (e.g., t-butoxycarbonyl (t-butylcarbonate), methoxycarbonyl (methylcarbonate), ethoxycarbonyl (ethylcarbonate)), and silyl ethers (e.g., trimethylsilyl ether, triethylsilyl ether, and triphenylsilyl ether).

Compounds having structures represented by formulas (7) to (9) are preferable as the compound represented by formula (6).

Formula (7)

Formula (8)

Formula (9)

wherein $R_{71}$, $R_{72}$, and $R_{73}$ in formulas (7) to (9) may be the same or different and each represents hydrogen, a halogen atom, a cyano group, a nitro group, a silyl group, or the monovalent organic group described above. X represents $>C=O$ or $—SO_2—$. Y represents the bivalent organic group described above. k is an integer of 1 to 5, m is an integer of 1 to 4, and n is an integer of 1 to 7. Note that at least one of $R_{71}$, $R_{72}$, $R_{73}$, and Y has the substituent group decomposable in the presence of an acid described above.

Compounds represented by formulas (7), (8) and (9) are derivatives of the following compounds containing hydroxyl groups. Any derivative in which the hydroxyl group is protected by the group decomposable in the presence of an acid described above can be used. Examples of the compound containing the hydroxyl group are 3-hydroxy-3-methylphthalide, ascorbic acid, bromocresol green, bromocresol purple, bromocresol blue, bromoxylenol blue, α-chloro-α-hydroxy-o-toluenesulfonic acid-γ-sultone, chlorophenol red, cresol phthalein, Eosin B, Eosin Y, fluorescein, fluorescein isocyanate, phenolphthalein, phenol red, tetrabromophenol blue, 3',3'',5',5''-tetrabromophenolphthalein, 4,5,6,7-tetrachlorofluorescein, 3',3'',5',5''-tetraIodophenolphthalein, 3',3'',5',5''-tetraiodophenolsulfonephthalein, thymolphthalein, naphtholphthalein, and Thymol Blue. At least two molecules of these compounds may be combined through a group having valence of 2 or more to obtain a dimer or trimer compound.

In each of the photosensitive compositions (RA), (RB), and (RC), the content of the dissolution inhibitor preferably falls within the range of about 3 to 40 parts by weight based on 100 parts by weight of the alkalisoluble resin due to the following reasons. If the content of the compound is less than 3 parts by weight, the dissolution rate of the nonexposed portion of the composition in an alkaline solution will increase, and the resolution of the resultant pattern will decrease accordingly. If the content of the composition exceeds 40 parts by weight, a resist residue will likely remain.

In each of the photosensitive compositions (RA), (RB), and (RC), the resin component is suitably used as a chemical sensitization type, if the above-mentioned alkali-soluble resin having a softening point of 150° C. or more and an average molecular weight of about 3,000 to 8,000 is used as resin component. In this case, the above type of dissolution inhibitor is not limited to the one described above. That is, if a compound can inhibit alkali solubility of the resin component during nonexposure and has a substituent group which can be decomposed in the presence of an acid, and can generate an alkali-soluble group upon decomposition of the substituent group, the dissolution inhibitor is not limited to the compound which has at least one substituent group decomposable in the presence of an acid and, after the decomposition, is converted into a compound which generates —COO⁻ or —SO₃⁻, e.g., the compound represented by formula (6).

Examples of the compound having the substituent group decomposable in the presence of an acid, i.e., the dissolution inhibitor other than the compound represented by formula (6) are compounds described in U.S. Pat. Nos. 4,491,628 and 4,603,101 and Published Unexamined Japanese Patent Application No. 63-27829, and a compound which contains a carboxylic acid group or phenolic hydroxyl group in its skeleton and in which some or all of hydroxyl terminal positions are substituted by protecting groups which can be decomposed in the presence of an acid. Examples of the protecting group are t-butyl ester, t-butoxycarbonyl(t-butylcarbonate), tetrahydropyranyl, and silyl. Practical examples of these compounds will be listed below. In these chemical formulas, m and n represent a polymerization degree of a polymer, or a copolymer composition (weight ratio).

-continued

-continued

-continued

-continued

-continued

When such a dissolution inhibitor is used in each of the photosensitive compositions (RA), (RB) and (RC), its content is preferably 3parts by weigh or more and less than 40 parts by weight based on 100 parts by weight of the alkali-soluble resin due to the following reasons. If the content of the dissolution inhibitor is less than 3 parts by weight, the resolution of the resultant pattern formed by using the photosensitive composition tends to decrease. If the content of the dissolution inhibitor is 40 parts by weight or more, the film formation properties of the photosensitive composition tend to be degraded, and the dissolution rate in the developing solution tends to decrease. Most preferably, the content of the dissolution inhibitor generally falls within the range of 10 to 30 parts by weight based on 100 parts by weight of the alkali-soluble resin. If the dissolution inhibitor consists essentially of an alkali-soluble polymer compound, it can also serve as a resin component, i.e., an alkali-soluble resin in the composition of the present invention. In this case, the content of the compound preferably falls within the range of 10 to 98 parts by weight based on the total amount of the solid component since an amount corresponding to that of the resin is added.

In each of the photosensitive compositions (RA), (RB), and (Re), if the above-mentioned alkali-soluble resin having a softening point of 150° C. or more and an average molecular weight of about 3,000 to 8,000 is used as resin component, a specific compound like the compound represented by formula (6) is used as dissolution inhibitor to increase a change in solubility of the resin component in an alkali solution when the composition is baked after exposure to light. Therefore, a combination of the specific alkali-soluble resin and the specific dissolution inhibitor as described above is most preferable to improve the resolution of the resultant resist pattern.

The same compound, which has a substituent group capable of cross-linking the alkali-soluble resin in the presence of an acid, can be used in the photosensitive compositions (RA), (RB), and (RC).

An aminoplast resin is generally used as the compound having the substituent group capable of cross-linking the alkali-soluble resin. Examples of the aminoplast resin are melamine-formaldehyde resin, urea-formaldehyde resin, glycol-formaldehyde resin, and benzoguanamine-formaldehyde resin. These resins can be used singly or in a mixture of at least two resins. For example, Cymel Beetle series resins (manufactured by American Cyanamid Co.) is known as a commercially available aminoplast resin.

The content of the compound having the substituent group capable of cross-linking the alkali-soluble resin, used in each of the photosensitive compositions (RA), (RB), and (RC) falls within the range of 3 to 20 parts by weight based on 100 parts by weight of the alkali-soluble resin due to the following reasons. If the content of this compound is less than 3 parts by weight, the sensitivity of the composition will decrease. If the content exceeds 20 parts by weight, a resist residue will likely remain.

Any of the photosensitive compositions (RA), (RB), and (RC) can be prepared in such a manner that the alkali-soluble resin, the compound which has a substotuent group decomposable in the presence of an acid or capable of cross-linking the alkali-soluble resin in the presence of an acid, and the acid generator, i.e., a compound represented by formula (3), (4), or (5) are dissolved in an organic solvent and filtered. Examples of the organic solvent are ketone-series solvents (e.g., cyclohexanone, acetone, ethyl methyl ketone, and methyl isobutyl ketone), cellosolve-series solvents (e.g., methyl cellosolve, methyl cellosolve acetate, ethyl cellosolve acetate, and butyl cellosolve acetate), ester-series solvents (e.g., ethyl acetate, butyl acetate, isoamyl acetate, and γ-butyrolactone), dimethylsulfoxide, and dimethylformamide-N-methylpyrrolidone. These organic solvents may be used singly or in the form of a mixture containing at least two kinds. The organic solvent may contain an appropriate amount of xylene, toluene, or an aliphatic alcohol such as isopropyl alcohol.

In addition, in the photosensitive compositions (RA), (RB), and (RC), if necessary, a surfactant or another polymer (e.g., an epoxy resin, polymethylmethacrylate, polymethylacrylate, propylene oxideethylene oxide copolymer, or polystyrene) may be added as a film modifier, or a dye may be mixed as an anti-reflection agent.

In the pattern forming method according to the present invention, a coating layer having a specific function is formed on the resin layer (i.e., the resist layer) after the second step (i.e., step b). Thereafter, the resin layer is subjected to exposure in the third step (i.e., the step c), baking in the fourth step (i.e., step d), and development in the fifth step (i.e., step e), thereby forming a pattern which has an improved cross-sectional shape. How the coating layer having a specific function is formed will be described in detail.

The chemical amplification-type resist used in the method of the invention, however, has a high sensitivity and is therefore readily influenced by oxygen, moisture, and other minor contaminations in a process atmosphere. As an example, S. A. MacDonald et al., SPIE Vol. 1,466, Advance in Resist Technology and Processing, p, 2, (1991) reports that a trace amount of dimethylaniline contained in an atmosphere deactivates an acid generated in the vicinity of the surface of a chemical amplification-type resist film when exposed to light to produce a surface inhibition layer with a dissolving rate significantly low in a developing solution, on the surface of the resist layer, and this surface inhibition layer remains like eaves to form a so-called T-topping profile on the surface of a resist pattern after exposure and development. The surface inhibition layer decreases the resolution of the resist, and the eaves-like layer produced on the resist pattern by the surface inhibition layer adversely affect the etching accuracy in a region of a semiconductor substrate.

In the method of the present invention, it is desirable that a fine pattern having a rectangular cross-section, a coating layer having a specific function be formed on the photosensitive resin layer (i.e., a resist layer) after the second step, in order to suppress the forming of an eaves-like layer due to the surface inhibition layer, and that the resist layer be processed in the third step (i.e., exposure) and the following steps.

This coating layer is preferably, an acidic layer which does not essentially absorb radiation. Preferable examples of a composition of the constituent components of this layer are (CA) an acidic water-soluble polymer, (CB) an organic acid and a water-soluble polymer, and (CC) an organic acid and an acidic water-soluble polymer.

More specifically, the step for forming the acidic coating layer is performed according to the process described below. First, an aqueous polymer solution, prepared by dissolving any of an acidic water-soluble polymer, a combination of an organic acid and a water-soluble polymer, and a combination of an organic acid and an acidic water-soluble polymer, in pure water is coated on the resin layer (i.e., the resist layer) by means of, e.g., a spin coating method or a dipping method. Subsequently, the resultant layer of the solution is dried at a temperature of about 150° C. or lower, preferably 120° C. or lower to form an acidic coating layer comprising as a main component the composition (CA), (CB), or (CC) described above. In this step, since the layer formation is performed using an aqueous solution, the surface of the underlying resin layer containing an organic substance such as the chemical amplification-type resist, as its main component, is not dissolved nor swell.

Preferable examples of the acidic water-soluble polymer for forming the coating layer comprising the composition (CA) or (CC) are a polymer having a carboxy group or a sulfonyl group as a substituent, and a copolymer containing a monomer unit having a carboxy group or a sulfonyl group as a substituent. Practical examples of these polymer are polyacrylic acid, polymethacrylic acid, polystyrenesulfonic acid, polymaleic acid, polyitaconic acid, an ltaconic acid-acrylic acid copolymer, an itaconic acid-methacrylic acid copolymer, an ethylene-maleic anhydrlde copolymer, an ethylene-methacrylic acid copolymer, a methyl vinyl ether-maleic anhydride copolymer, a styrene-maleic anhydride copolymer, an isobutylene-maleic anhydride copolymer, and copolymers obtained by partially esterifying the above copolymers containing maleic anhydride as a constituent unit by reacting them with an alcohol. Examples of the alcohol used in the partial esterification are methyl alcohol, ethyl alcohol, n-propyl alcohol, and isopropyl alcohol. These acidic water-soluble polymers can be used singly or in the form of a mixture of two or more types of them. Note that, of the acidic water-soluble polymers exemplified above, each copolymer containing maleic anhydride becomes acidic when dissolved in pure water in the process of forming the coating layer because an anhydrous bond in maleic anhydride cleaves into carboxylic acid.

The organic acid for forming the coating layer comprising the composition (CB) or (CC) is preferably a compound having a carboxy group, a sulfonyl group, or a hydroxyl group as a substituent. Practical examples of the compounds are acetic acid, propionic acid, butyric acid, methacrylic acid, sorbic acid, oxalic acid, succinic acid, maleic acid, 2-hydroxybutyric acid, malic acid, sulfoacetic acid, isethionic acid, cyclohexanedicarboxylic acid, hexahydrocarboxylic acid, phenol, resorcin, pyrogallol, phthalic acid, pyromellitic acid, salicylic acid, resorcylic acid, sulfobenzoic acid, 5-sulfosalicylic acid, benzenesulfonic acid, toluenesulfonic acid, benzenedisulfonic acid, phenol-2,4-disulfonic acid, and naphthalenesulfonic acid. These organic acids can be used singly or in the form of a mixture of two or more types of them.

Practical examples of the water-soluble polymer for forming a coating layer comprising the composition (CB) are polyvinyl alcohol, polyvinyl pyrrolidone, polyacrylamide, polyethyleneoxide, pullulan, dextran, methyl cellulose, hydroxymethyl cellulose, hydroxypropyl cellulose, a partially seponified product of polyvinyl acetate, a copolymer of vinyl pyrrolidone and vinyl alcohol, a copolymer of styrene and ethyleneoxide, a copolymer of ethylene and vinyl alcohol, polyvinyl methyl ether, and a carboxyvinyl polymer. These water-soluble polymers can be used singly or in the form of a mixture of two or more types of them.

The acidic coating layer may contain a surfactant as a film-modifying agent where necessary. Such a surfactant is preferably a nonionic surfactant. Practical examples are polyoxyethylene alkyl phenyl ether, polyoxyethylene alkyl ether, polyoxyethylene fatty acid ester, polyoxyethylene sorbitan fatty acid ester, a Polyoxyethylene-polyoxypropylene block polymer, sorbitan fatty acid ester, fatty acid alkylolamide, polyoxyethylene lanolin alcohol ether, and polyoxyethylene lanolin fatty acid ester. A coating layer containing any of these surfactants is preferable in that precipitation of polymers in the subsequent step is prevented.

The thickness of the acidic coating layer is preferably about 10 to 1,000 nm, and more preferably 50 to 500 nm. If the thickness of the coating layer is less than 10 nm, it may become difficult to sufficiently achieve the effect of preventing formation of the inhibition surface layer on the surface of the underlying resin layer. If the thickness of the radiationsensitive layer exceeds 1,000 nm, on the other hand, the resolution of a formed pattern may be decreased. Note that the thickness of the acidic coating layer does not depend on the thickness of the underlying resin layer but is arbitrarily determined by taking into account the thickness of a inhibition surface layer to be formed on the surface of the resin layer.

The acidic coating layer can be dissolved and removed, in its entirety (both the exposed portions and the nonexposed portions), from the resin layer in the development step using an alkaline developing solution.

Alternatively, the acidic coating layer may be treated with pure water, thereby removing the acidic coating layer after the exposure step and the baking step and prior to the development step. Once the acidic coating layer is removed prior to the development step, the alkaline concentration of the aqueous alkaline solution (i.e., the developing solution) will no longer be changed by the acidic component of the coating layer, such as the acidic water-soluble copolymer and/or the organic acid. This will facilitate the forming of a high-resolution pattern.

The acidic coating layer protects the resin layer (i.e., the resist layer) during the exposure step and the baking step, completely shielding the resin layer from that undesirable component of the process atmosphere which suppresses the reaction among the components of the photosensitive composition (i.e., the main component of the resin layer), in particular from the component which makes the acid lose its activity. Thus, the acidic coating layer prevents the forming of a surface inhibition layer on the resin layer, making it possible to form a fine pattern having a rectangular cross-section in the development step.

The acidic component of the coating layer can neutralize the basic compound such as amine, which is considered to involve in forming a surface inhibition layer on the resin layer, whereby it is possible to form a fine pattern having a rectangular cross-section and having no eaves-like layer on the surface.

In the case where the acidic coating layer contains both an acidic water-soluble polymer and an organic acid, the resin layer is shielded for a long time from the undesirable component of the process atmosphere. This serves to suppress more effectively the forming of a surface inhibition layer.

In the pattern forming method, a polymer may be dissolved in an organic solvent which does not essentially dissolve the photosensitive composition (i.e., resist) and the obtained polymer solution may be coated on the resin layer (i.e., the resist layer) and dried to form a neutral coating layer.

Examples of the polymer are rubber-based compounds, such as butyl rubber, isoprene rubber, nitrile rubber, chloroprene rubber, ethylene-propylene rubber, poly-4-methylpentene-1, polystyrene, polyvinyl butyral, and alkyl-modified compound or copolymers obtained by substituting part of these polymers by an alkyl group. These polymers can be used singly or in the form of a mixture of two or more types of them.

The organic solvent for dissolving the polymer is preferably selected from an aromatic hydrocarbon, a chlorine-containing hydrocarbon, and an aliphatic hydrocarbon, each of which does not essentially dissolve the resin layer whose main component is a photosensitive composition. Examples of the aromatic hydrocarbon are toluene, xylene, ethylbenzene, and chlorobenzene. Examples of the chlorine-containing hydrocarbon are methylene chloride, propylene chloride, and ethylene chloride. Examples of the aliphatic hydrocarbon are hexane and cyclohexane. These organic solvents can be used singly or in the form of a mixture of two or more types of them. By using these organic solvents, the neutral coating layer can be dissolved away after pattern exposure and baking and before development.

The neutral coating layer may contain, as a film-modifying agent, a surfactant similar to those used in the acidic coating layer in the method according to the first embodiment as needed.

For the same reasons as for the acidic coating layer, the thickness of the neutral coating layer is set to between preferably about 10 and 1,000 nm, and more preferably 50 and 500 nm.

If the neutral coating layer is formed in the way described above, a surface inhibition layer will be formed on the resin layer. When the neutral coating layer is dissolved and removed by a prescribed organic solvent after the exposure and the baking, however, the surface inhibition layer is simultaneously removed. Hence, the pattern formed upon completion of development has no eaves-like layer which should be formed by the surface inhibition layer.

In the method according to the present invention, the protective layer and the coating layer, which are formed beneath and upon the resin layer (i.e., the resist layer), respectively, make it possible to form a high-resolution pattern comprising lines and spaces which have a sharp rectangular cross-section.

The present invention will now be described in more detail, by way of its examples. Note that the examples are described to facilitate the understanding of the invention, and hence do not particularly limit the present invention.

EXAMPLE 1

Polyamic acid (Kemitite CT4200T manufactured by Toshiba Chemical Co.) solution was spin-coated on a chromium mask substrate. The polyamic acid, thus coated, was heated at 250° C. for 5 minutes, thereby imidizing the polyamic acid and forming a protective layer of polyimide. The protective layer had a thickness of about 0.05 to 0.1 $\mu$m.

Next, a chemical amplification type resist was coated on the protective layer, forming a resist layer. The resist is a photosensitive composition containing 100 parts by weight of poly-vinylphenol resin in which some of the pendants are tert-butoxymethylated, 17 parts by weight of tert-butoxycarbonyl derivative of o-cresolphthalein as a dissolution inhibitor, and 7 parts by weight of bis(-phenylsulfonyl)methane as an acid generator. The resist is a positive type one in which an acid generator generates an acid, which decomposes the dissolution inhibitor, when exposed to radiation, X ray, high-energy electron beam, or the like.

Thereafter, a coating layer comprising a copolymer of methyl vinyl ether and maleic anhydride, which has a thickness of 0.1 to 0.2 $\mu$m, was formed on the resist layer, thereby shielding the resist layer from any material which is contained in the air and which would nullify the activity of the photosensitive composition. Then, the resist layer is pattern-exposed to high-energy electron beam having a diameter of 0.5 $\mu$m through the coating layer. Specifically, the resist layer was scanned with the beam at the exposure of 5 $\mu$C/cm$^2$, whereby the resist layer is selectively exposed.

The resist layer, thus exposed, was baked at 100° C. for 2 minutes. The resist layer was then developed by an aqueous tetramethylammonium hydroxide (TMAH) solution (concentration: 1.90% or 1.67%), whereby only the exposed portions of the resist layer were dissolved and removed, forming a resist pattern which is shown in FIG. 4.

Figure 4:
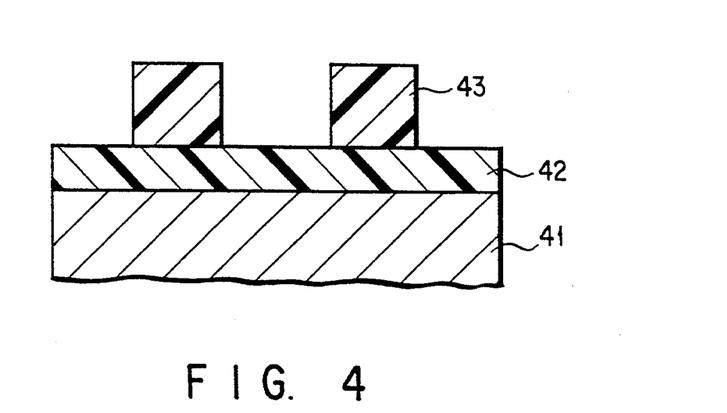
FIG. 4 is a cross-sectional view of the resist pattern formed by the method of the present invention.

As is evident from FIG. 4, the resist pattern formed on the protective layer 42, which in turn is formed on the chromium mask 41 (substrate), comprised fine lines and spaces, each line having a cross-section which was substantially rectangular and had no prominent sloped profile, unlike the lines of the resist pattern formed by the conventional method. As can be understood from FIG. 4, too, each space has a cross-section so rectangular that it can serve to form a contact hole.

EXAMPLE 2

A resin composition (solution), which contains bisphenol F-type epoxy resin (Epikoat 807 manufactured by Yuka Shell Epoxy K. K.), a phenol-based curing agent (VH-4170 manufactured by Dai-Nihon Ink Co., Ltd.), and triphenylphosphine as a curing catalyst, was spin-coated on a chromium mask substrate. The resin composition, thus coated, was heated at 175° C. for 30 seconds and was thereby cured, forming a protective layer of epoxy resin. The protective layer had a thickness of about 0.05 to 0.1 $\mu$m.

Next, the same chemical amplification type resist as used in Example 1 was coated on the protective layer, forming a resist layer. Then, the same coating layer as formed in Example 1 was formed on the resist layer, thereby shielding the resist layer from any material which is contained in the air and which would nullify the activity of the photosensitive composition. Then, the resist layer is pattern-exposed to high-energy electron beam having a diameter of 0.5 μm through the coating layer. Specifically, the resist layer was scanned with the beam at the exposure of 5 μC/cm², whereby the resist layer is selectively exposed.

The resist layer, thus exposed, was baked at 110° C. for 1 minute. The resist layer was then developed by an aqueous tetramethylanunonium hydroxide (TMAH) solution (concentration: 1.90% or 1.67%), whereby only the exposed portions of the resist layer were dissolved and removed, forming a resist pattern. The resist pattern, thus formed, comprised fine lines and spaces, each line having a cross-section which was substantially rectangular and had no prominent sloped profile.

EXAMPLE 3

A solution of Poly(trifluoroethyl-α-chloroacrylate) (EBR-9 manufactured by Toray Industries, Inc.), which is represented by the following formula, was spin-coated on a chromium mask substrate.

wherein n represents the degree of polymerization.

Poly(trifluoroethyl-α-chloroacrylate) thus coated, was heated at 90° C. for 30 minutes. The solvent used was thereby removed completely, curing the polymer and forming a protective layer of the polymer. The protective layer had a thickness of about 0.05 to 0.2 μm. The solvent for the polymer is of the same type as used for the resist described below, (i.e., ethyl cellosolve acetate), but mixing of the protective layer and the resist layer noted below can be prevented by heating at high-temperature as described above.

Next, the same chemical amplification type resist as used in Example 1 was coated on the protective layer, forming a resist layer. Then, the same coating layer as formed in Example 1 was formed on the resist layer, thereby shielding the resist layer from any material which is contained in the air and which would nullify the activity of the photosensitive composition. Then, the resist layer is pattern-exposed to high-energy electron beam having a diameter of 0.5 μm through the coating layer. Specifically, the resist layer was scanned with the beam at the exposure of 5 μC/cm², whereby the resist layer Is selectively exposed.

The resist layer, thus exposed, was baked at 110° C. for 1 minute. The resist layer was then developed by an aqueous tetramethylammonium hydroxide (TMAH) solution (concentration: 1.90% or 1.67%), whereby only the exposed portions of the resist layer were dissolved and removed, forming a resist pattern. The resist pattern, thus formed, comprised fine lines and spaces, each line having a rectangular cross-section and no prominent sloped profile.

Thereafter, the chromium mask substrate with the resist pattern formed on it was exposed to O₂ asher for 80 seconds, thereby removing those portions of the protective layer which were exposed to light through the spaces of the pattern. Using the resist pattern (and the protective layer) as an etching mask, the chromium layer was etched, transferring a pattern comprising fine lines and narrow spaces, each line having a cross-section which was substantially rectangular, onto the chromium mask substrate.

As has been described in detail, the present invention provides a method of forming a pattern, which can form a fine resist pattern, in particular a fine pattern of chemical amplification type resist, which has a greatly improved resolution, or comprises fine lines and spaces each line having a cross-section which is substantially rectangular and have no prominent sloped profile or no undercut profile. The present invention is therefore useful when applied to micropatterning of electronic components, and is very valuable from an industrial point of view.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A pattern forming method comprising steps of:
   (a) forming on a substrate an organic film capable of suppressing diffusion of a contaminant from the substrate;
   (b) forming on the organic film a resin layer which comprises a photosensitive composition containing a compound having a substituent group capable of being decomposed or cross-linked in the presence of an acid and a compound which generates an acid when exposed to light;
   (c) pattern-exposing the resin layer to light;
   (d) baking the resin layer after exposure; and
   (e) developing the resin layer, thereby to selectively remove or leave the exposed portions of the resin layer.

2. The method according to claim 2, wherein the organic film is a polymer film comprising a polyimide resin represented by the following formula (1):

wherein R₁ is a tetravalent organic group, R₂ is a divalent organic group, and n represents the degree of polymerization.

3. The method according to claim 1, wherein the organic film is a polymer film comprising epoxy resin.

4. The method according to claim 1, wherein the organic film is a polymer film comprising polyacrylate resin represented by the following formula (2):

$$\begin{matrix} \text{—(}CR_3\text{—}CH_2\text{)}_{\overline{n}} & (2) \\ | & \\ COOR_4 & \end{matrix}$$

wherein $R_3$ and $R_4$ may be the same or different and are independently hydrogen, a halogen atom, or an alkyl group which can be substituted by a halogen atom, and n represents the degree of polymerization.

5. The method according to claim 1, wherein the organic film has a thickness ranging from about 0.003 μm to 0.03 μm.

6. The method according to claim 1, wherein the photosensitive composition contains the compound having a substituent group capable of being decomposed in the presence of an acid and further contains an alkali-soluble resin.

7. The method according to claim 1, wherein the photosensitive composition further contains an alkali-soluble resin, and the compound which generates an acid is one represented by the following formula (3):

$$\begin{matrix} O & R_{32} & \\ \| & | & \\ R_{31}\text{—}S\text{—}C\text{—}R_{33} & (3) \\ \| & | & \\ O & R_{34} & \end{matrix}$$

wherein $R_{31}$ represents a monovalent organic group or a monovalent organic group into which at least one selected from the group consisting of a halogen atom, a nitro group, and a cyano group is introduced, each of $R_{32}$, $R_{33}$, and $R_{34}$ independently represents hydrogen, a halogen atom, a nitro group. a cyano group, a monovalent organic group, or a monovalent organic group into which at least one selected from the group consisting of a halogen atom, a nitro group, and a cyano group is introduced.

8. The method according to claim 7, wherein at least one of $R_{32}$, $R_{33}$, and $R_{34}$ in the formula (3) is cyano group.

9. The method according to claim 7, wherein at least one of $R_{32}$, $R_{33}$, and $R_{34}$ in the formula (3) is hydrogen.

10. The method according to claim 1, wherein the photosensitive composition further contains an alkali-soluble resin, and the compound which generates an acid is one represented by the following formula (4):

$$\begin{matrix} O & H & \\ \| & | & \\ R_{41}\text{—}S\text{—}C\text{—}R_{42}\text{—}R_{43} & (4) \\ \| & | & \\ O & H & \end{matrix}$$

wherein each of $R_{41}$ and $R_{43}$ independently represents a monovalent organic group or a monovalent organic group into which at least one selected from the group consisting of a halogen atom, a nitro group, and a cyano group is introduced, and $R_{42}$ represents a sulfonyl or carbonyl group.

11. The method according to claim 1, wherein the photosensitive composition further contains an alkali-soluble resin, and the compound which generates an acid is one represented by the following formula (5):

$$\begin{matrix} O & R_{53} & O & \\ \| & | & \| & \\ R_{51}\text{—}S\text{—}C\text{——}S\text{—}R_{52} & (5) \\ \| & | & \| & \\ O & R_{54} & O & \\ & | & & \\ & R_{55} & & \end{matrix}$$

wherein each of $R_{51}$, $R_{52}$, and $R_{55}$ independently represents a monovalent organic group or a monovalent organic group into which at least one selected from the group consisting of a halogen atom, a nitro group, and a cyano group is introduced, $R_{53}$ represents hydrogen, a monovalent organic group, or a monovalent organic group into which at least one selected form the group consisting of a halogen atom, a nitro group, and a cyano group is introduced, and $R_{54}$ represents a sulfonyl group, a sulfinyl group, sulfur, and a carbonyl group.

12. The method according to claim 1, wherein the resin layer is pattern-exposed to ultraviolet radiation, x ray, electron beam, or charge corpuscular beam in step (c).

13. The method according to claim 1, wherein the resin layer is developed by using an alkaline solution in step (e).

14. The method according to claim 1, wherein said organic film is a film selected from the group consisting of polyamide resin, polyimide resin, polyamideimide resin, polyaminobismaleimide resin, polyetherimide, phenolic resin, diallylphthalate resin, urea resin, alkyde resin, urethane resin, unsaturated polyester resin, polysulfone, polyethersulfone, polyparaxylylene, melamine resin, phenol-formaldehyde resin and epoxy resin film.

15. The method according to claim 1, consisting essentially of steps (a), (b), (c), (d) and (e).

16. The method according to claim 1, consisting of steps (a), (b), (c), (d) and (e).

* * * * *